(12) United States Patent
Van Empel et al.

(10) Patent No.: US 8,901,521 B2
(45) Date of Patent: Dec. 2, 2014

(54) MODULE AND METHOD FOR PRODUCING EXTREME ULTRAVIOLET RADIATION

(75) Inventors: Tjarko Adriaan Rudolf Van Empel, Eindhoven (NL); Vadim Yevgenyevich Banine, Helmond (NL); Vladimir Vitalevich Ivanov, Moscow (RU); Erik Roelof Loopstra, Eindhoven (NL); Johannes Hubertus Josephina Moors, Helmond (NL); Jan Bernard Plechelmus Van Schoot, Eindhoven (NL); Yuri Johannes Gabriël Van De Vijver, Best (NL); Gerardus Hubertus Petrus Maria Swinkels, Eindhoven (NL); Hendrikus Gijsbertus Schimmel, Utrecht (NL); Dzmitry Labetski, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 336 days.

(21) Appl. No.: 12/197,693

(22) Filed: Aug. 25, 2008

(65) Prior Publication Data
US 2009/0090877 A1   Apr. 9, 2009

Related U.S. Application Data

(63) Continuation-in-part of application No. 12/078,663, filed on Apr. 2, 2008, now Pat. No. 7,763,871.

(60) Provisional application No. 60/935,643, filed on Aug. 23, 2007, provisional application No. 61/136,148, filed on Aug. 14, 2008, provisional application No. 61/136,145, filed on Aug. 14, 2008.

(51) Int. Cl.
*G01J 3/10*      (2006.01)
*G03F 7/20*     (2006.01)
*H05G 2/00*    (2006.01)

(52) U.S. Cl.
CPC ........ *G03F 7/70916* (2013.01); *G03F 7/70175* (2013.01); *G03F 7/70983* (2013.01); *H05G 2/003* (2013.01); *H05G 2/008* (2013.01)
USPC .................. 250/504 R; 250/503.1; 250/493.1

(58) Field of Classification Search
None
See application file for complete search history.

(56) References Cited

U.S. PATENT DOCUMENTS 1,331,018 A * 2/1920 Luthy ........................... 429/143
1,497,349 A * 6/1924 Robinson ........................... 54/5
(Continued)

FOREIGN PATENT DOCUMENTS

| CN | 1497349 | 5/2004 |
|---|---|---|
| JP | 8-227847 | 9/1996 |

(Continued)

*Primary Examiner* — Andrew Smyth
(74) *Attorney, Agent, or Firm* — Pillsbury Winthrop Shaw Pittman, LLP

(57) ABSTRACT

A module for producing extreme ultraviolet radiation includes a supply configured to supply droplets of an ignition material to a predetermined target ignition position and a laser arranged to be focused on the predetermined target ignition position and to produce a plasma by hitting such a droplet which is located at the predetermined target ignition position in order to change the droplet into an extreme ultraviolet producing plasma. Also, the module includes a collector mirror having a mirror surface constructed and arranged to reflect the radiation in order to focus the radiation on a focal point. A fluid supply is constructed and arranged to form a gas flow flowing away from the mirror surface in a direction transverse with respect to the mirror surface in order to mitigate particle debris produced by the plasma.

31 Claims, 7 Drawing Sheets

(56) References Cited

U.S. PATENT DOCUMENTS

| | | | |
|---|---|---|---|
| 6,469,310 B1* | 10/2002 | Fiedorowicz et al. | 250/492.22 |
| 6,738,452 B2* | 5/2004 | McGregor et al. | 378/119 |
| 6,792,076 B2* | 9/2004 | Petach et al. | 378/119 |
| 6,831,963 B2* | 12/2004 | Richardson | 378/119 |
| 6,855,943 B2* | 2/2005 | Shields | 250/504 R |
| 7,034,320 B2* | 4/2006 | Silverman et al. | 250/492.2 |
| 7,116,405 B2* | 10/2006 | Johnson | 355/67 |
| 7,233,013 B2* | 6/2007 | Hergenhan et al. | 250/504 R |
| 7,271,401 B2* | 9/2007 | Imai et al. | 250/504 R |
| 7,323,821 B2* | 1/2008 | Schwarzl et al. | 315/111.41 |
| 7,365,349 B2* | 4/2008 | Partlo et al. | 250/504 R |
| 7,372,049 B2* | 5/2008 | Van Herpen et al. | 250/492.2 |
| 7,411,203 B2* | 8/2008 | Fomenkov et al. | 250/504 R |
| 7,462,851 B2* | 12/2008 | Banine et al. | 250/504 R |
| 7,501,641 B2* | 3/2009 | Silverman et al. | 250/492.2 |
| 7,528,395 B2* | 5/2009 | Koshelev et al. | 250/493.1 |
| 7,626,188 B2* | 12/2009 | Shirai et al. | 250/504 R |
| 7,868,304 B2* | 1/2011 | Bakker et al. | 250/492.2 |
| 8,227,847 B2* | 7/2012 | Neuilly et al. | 257/301 |
| 2002/0070353 A1* | 6/2002 | Richardson | 250/492.1 |
| 2003/0223541 A1* | 12/2003 | Petach et al. | 378/119 |
| 2003/0223542 A1* | 12/2003 | Shields | 378/119 |
| 2003/0223546 A1* | 12/2003 | McGregor et al. | 378/143 |
| 2004/0046949 A1* | 3/2004 | Ohgushi et al. | 355/53 |
| 2004/0105082 A1* | 6/2004 | Koshelev et al. | 355/53 |
| 2004/0109151 A1* | 6/2004 | Bakker et al. | 355/69 |
| 2004/0183031 A1* | 9/2004 | Silverman et al. | 250/492.2 |
| 2005/0122593 A1* | 6/2005 | Johnson | 359/650 |
| 2005/0148210 A1* | 7/2005 | Bakker et al. | 438/798 |
| 2005/0254029 A1* | 11/2005 | Banine et al. | 355/53 |
| 2006/0012761 A1* | 1/2006 | Bakker et al. | 355/30 |
| 2006/0119828 A1* | 6/2006 | Ito et al. | 355/69 |
| 2006/0132046 A1* | 6/2006 | Schwarzl et al. | 315/111.41 |
| 2006/0163500 A1* | 7/2006 | Inoue et al. | 250/493.1 |
| 2006/0175558 A1* | 8/2006 | Bakker et al. | 250/492.2 |
| 2006/0186356 A1* | 8/2006 | Imai et al. | 250/504 R |
| 2006/0226377 A1* | 10/2006 | Hergenhan et al. | 250/493.1 |
| 2006/0237668 A1* | 10/2006 | Silverman et al. | 250/492.1 |
| 2006/0243927 A1* | 11/2006 | Tran et al. | 250/504 R |
| 2006/0250599 A1* | 11/2006 | Bakker et al. | 355/67 |
| 2006/0255298 A1* | 11/2006 | Bykanov et al. | 250/504 R |
| 2007/0023705 A1* | 2/2007 | Partlo et al. | 250/504 R |
| 2007/0040999 A1* | 2/2007 | Wilhelmus Van Herpen et al. | 355/30 |
| 2007/0069159 A1* | 3/2007 | Banine et al. | 250/493.1 |
| 2007/0125964 A1* | 6/2007 | Van Herpen et al. | 250/492.2 |
| 2007/0145297 A1* | 6/2007 | Freriks et al. | 250/492.2 |
| 2007/0158594 A1* | 7/2007 | Shirai et al. | 250/504 R |
| 2007/0158597 A1* | 7/2007 | Fomenkov et al. | 250/504 R |
| 2008/0218709 A1* | 9/2008 | Van Vliet et al. | 355/30 |

FOREIGN PATENT DOCUMENTS

| | | | | |
|---|---|---|---|---|
| JP | 2003-008124 A | | 1/2003 | |
| JP | 2005-197081 A | | 7/2005 | |
| JP | 2006-080255 | | 3/2006 | |
| JP | 2006080255 A | * | 3/2006 | |
| JP | 2006184577 A | * | 7/2006 | |
| JP | 2006-202671 | | 8/2006 | |
| JP | 2006-222426 | | 8/2006 | |
| JP | 2006202671 A | * | 8/2006 | |
| JP | 2006222426 A | * | 8/2006 | |
| JP | 2006-286623 | | 10/2006 | |
| JP | 2006286623 A | * | 10/2006 | |
| JP | 2007-035660 | | 2/2007 | |
| JP | 2007035660 A | * | 2/2007 | |
| JP | 2007064210 A | * | 3/2007 | |
| JP | 2007-134166 | | 5/2007 | |
| JP | 2007134166 A | * | 5/2007 | |
| JP | 2007-184577 | | 7/2007 | |
| JP | 2007184577 A | * | 7/2007 | |
| JP | 2008227847 A | * | 9/2008 | |
| JP | 2008-277481 | | 11/2008 | |
| JP | 2008277481 A | * | 11/2008 | |
| WO | 01/31678 A1 | | 5/2001 | |
| WO | 2004/092693 A2 | | 10/2004 | |
| WO | WO 2006136967 A2 | * | 12/2006 | G03F 7/20 |
| WO | WO 2006137014 A1 | * | 12/2006 | B08B 7/00 |
| WO | 2007/064210 | | 6/2007 | |

* cited by examiner

MODULE AND METHOD FOR PRODUCING EXTREME ULTRAVIOLET RADIATION

CROSS-REFERENCE TO RELATED APPLICATIONS

This application is a Continuation-In-Part of co-pending U.S. patent application Ser. No. 12/078,663, filed Apr. 2, 2008, and also claims priority to U.S. Provisional Patent Application No. 60/935,643, filed Aug. 23, 2007; U.S. Provisional Patent Application No. 61/136,148, filed Aug. 14, 2008; and U.S. Provisional Patent. Application No. 61/136,145 filed Aug. 14, 2008. The contents of these applications are hereby incorporated in their entirety by reference.

FIELD

The present invention relates to a module and a method for producing extreme ultraviolet radiation. The module and the method can be applied in a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to be able to project ever smaller structures onto a substrate, it has been proposed to use extreme ultraviolet radiation having a wavelength within the range of 10-20 nm, preferably within the range of 13-14 nm.

In order to produce such radiation, a plasma may be produced by focusing a laser at a droplet, thereby changing the droplet, preferably tin droplets, into an extreme ultraviolet radiation producing plasma. Often, a so-called collector mirror may be used to focus the radiation in a focal point.

In addition to extreme ultraviolet radiation, the plasma generally produces debris in the form of particles, such as thermalized atoms, ions, neutrals, nanoclusters, and/or microparticles. The debris may cause damage to the collector mirror and other optics. In order to prevent the debris from causing damage, a buffer gas may be used in the vicinity of the plasma in order to mitigate the debris. Still, it has been found that the collector mirror degrades and deforms when the extreme ultraviolet radiation is being produced.

SUMMARY

It is desirable to prevent the deformation and degradation of the collector mirror.

According to an aspect of the invention, there is provided a module for producing extreme ultraviolet radiation including a supply configured to supply one or more droplets of an ignition material to a predetermined target ignition position; a laser arranged to be focused on the predetermined target ignition position and to produce a plasma by hitting the droplet when it is located at the predetermined target ignition position in order to change the droplet into an extreme ultraviolet producing plasma; a collector mirror having a mirror surface constructed and arranged to reflect the radiation in order to focus the radiation in a focal point; and a fluid supply constructed to form a gas flow flowing away from the mirror surface in a direction transverse with respect to the mirror surface in order to mitigate particle debris produced by the plasma.

According to another aspect of the invention, such a module may be included in a lithographic projection apparatus arranged to project a pattern from a patterning device onto a substrate, and specifically in such an apparatus including: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate.

According to another aspect of the invention, there is provided a method for producing extreme ultraviolet radiation, wherein a radiation beam, for instance a laser beam, is focused at a droplet of an ignition material, the droplet being located at a predetermined target ignition position in order to change the droplet into an extreme ultraviolet radiation producing plasma; reflecting the radiation using a collector mirror having a mirror surface in order to focus the radiation in a focal point; and providing a gas flow flowing away from the mirror surface in a direction transverse with respect to the mirror surface in order to mitigate particle-debris produced by the plasma.

According to an aspect of the invention, there is provided a module for producing extreme ultraviolet radiation, including a fuel supply configured to supply an ignition material to a desired position proximate an axis within a chamber; a radiation source configured to output a radiation beam, the radiation beam directed to the desired position so as to irradiate the ignition material to form a plasma that is configured to emit an extreme ultraviolet radiation; a collector mirror including a mirror surface positioned within the chamber, the mirror surface constructed and arranged to reflect and focus the extreme ultraviolet radiation on a focal point positioned proximate the axis; and a fluid supply constructed to supply a gas flow along a direction of the axis to mitigate particle debris produced by the plasma.

According to an aspect of the invention, there is provided a method for producing extreme ultraviolet radiation, the method including irradiating an ignition material with a radiation beam to form a plasma that is configured to emit an extreme ultraviolet radiation; reflecting and focusing the extreme ultraviolet radiation using a collector mirror that includes a mirror surface at a focal point; and supplying a gas flow that flows away from the mirror surface in a direction substantially transverse with respect to the mirror surface to mitigate particle debris produced by the plasma.

In an aspect of the invention, there is provided a module for producing extreme ultraviolet radiation, the module including an extreme ultraviolet radiation-emitting source, the source being provided with a supply configured to supply a fluid of an ignition material to a predetermined target ignition position and a target-igniting mechanism constructed and arranged to produce a plasma from the ignition material at the target ignition position, the plasma emitting the extreme ultraviolet radiation; a collector mirror constructed and arranged to focus radiation emitted by the plasma to at a focal point; and a heat sink having a thermal energy-diverting surface constructed and arranged to divert thermal energy away from the target ignition position, wherein the heat sink is located at a position proximate the target ignition position.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
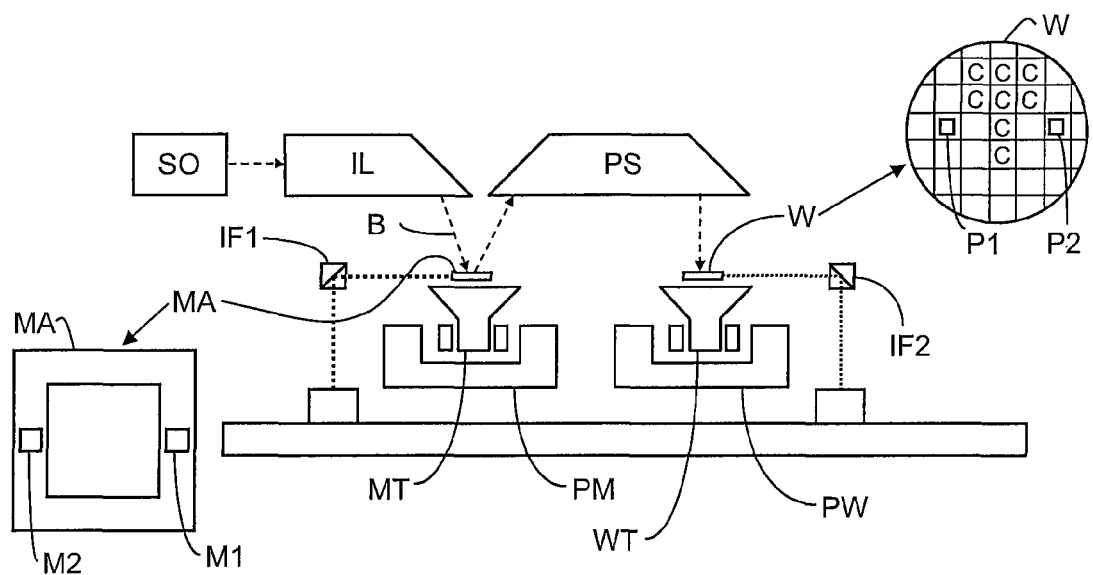
FIG. 1 depicts a lithographic apparatus according to an embodiment of the invention.

FIG. 1 schematically depicts a lithographic apparatus according to one embodiment of the invention. The apparatus includes: an illumination system (illuminator) IL configured to condition a radiation beam B (e.g. EUV radiation); a support structure or patterning device support (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD (not shown in FIG. 1) including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD (not shown in FIG. 1) for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN (not shown in FIG. 1) and a condenser CO (not shown in FIG. 1). The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. After being reflected by the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
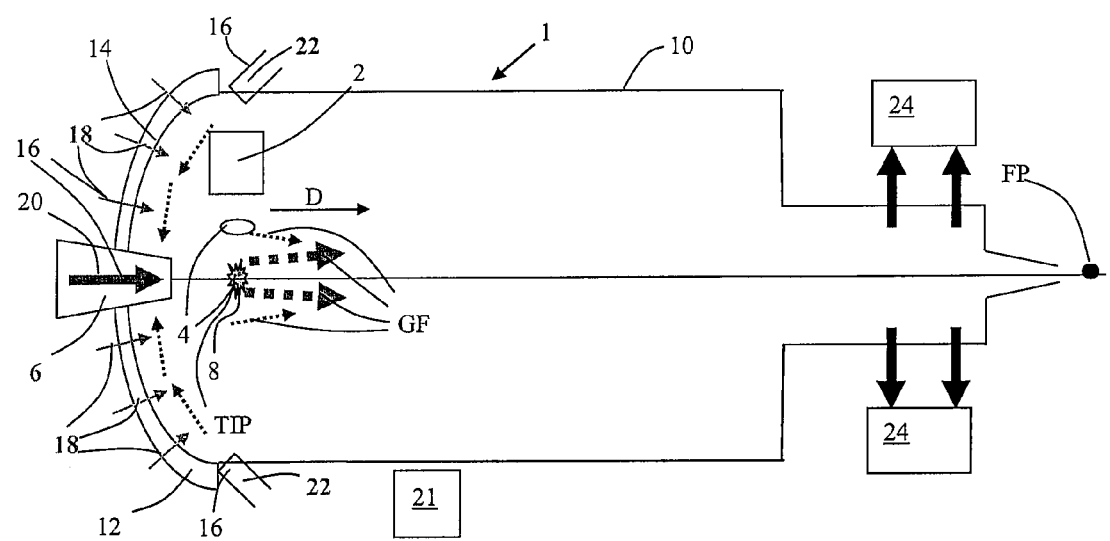
FIG. 2 depicts a schematic view of a module according to an embodiment of the invention.

FIG. 2 depicts a schematic view of a module 1 configured to produce extreme ultraviolet radiation according to an embodiment of the invention. The module 1 may suitably serve as the source SO and provide the radiation beam to the illuminator IL. The module 1 includes a supply (e.g. fluid supply) 2 configured to supply one or more droplets 4 of an ignition material to a predetermined target ignition position TIP. Also, a radiation source, e.g. a laser or laser source 6 is included in the module 1, the laser 6 being arranged to generate a beam that is focused onto the predetermined target ignition position TIP so as to produce an extreme ultraviolet producing plasma 8 by hitting a droplet 4 which is located at the predetermined target ignition position TIP. In an embodiment, the droplet may be located proximate an axis of the chamber. The module 1 further includes a chamber 10 including a collector mirror 12 that includes a mirror surface 14 constructed and arranged to reflect the radiation in order to focus the radiation on a focal point FP and a fluid supply 16 constructed to form a gas flow GF flowing away from the mirror surface 14 in a direction D transverse with respect to the mirror surface 14 in order to mitigate particle debris produced by the plasma.

The particle debris mitigation preferably occurs using the Péclet effect. The so-called Péclet number describes the rate of advection of a flow to its rate of diffusion, often thermal diffusion. It is equivalent to the product of the Reynold number and the Prandtl number in the case of thermal diffusion, and the product of the Reynolds number and the Schmidt number in the case of mass dispersion. By creating a flow such that its advection is sufficiently high, the Péclet number becomes so high such that the particle debris reaching the collector mirror will be sufficiently low. Suitable speeds for the gas flow may be found above a speed of about 5 m/s. At speeds of about 5 m/s and higher, hydrides, such as $SnH_4$ may be transported away from the collector mirror surface 14. Typically, the speed for the gas flow may be about 100 m/s.

In an embodiment, the focal point may be positioned proximate the axis. The axis may be an optical axis. The gas flow GF may be continuously supplied by the apertures 18 during generation of the plasma.

As heat load of a more or less stationary buffer gas in the vicinity of target ignition position may cause deformation and degradation of the collector mirror, a gas flow is being formed when the module 1, depicted in FIG. 2, is in operation, which gas flow GF flows away from the mirror surface 14, thereby reducing the amount of thermal contact between the gas in the gas flow GF and the mirror surface 14.

Serving as fluid supply 16, one or more apertures 18 may be provided in the mirror 12 each configured to allow for passage of at least a part of the gas flow GF. Preferably, one or more apertures 20 may be provided in the laser 6 to allow for passage of at least a part of the gas flow GF. In another embodiment, the gas flow GF is supplied to the chamber 10 with a plurality of fluid supplies (or fluid supply units) 22 arranged in the module 1. Each fluid supply 22 is arranged to provide a subflow of gas, and each of the subflows being directed towards a central region, such that the gas flow, away from the mirror surface, is provided by a collision between the subflows occurring in the central region.

The module 1 includes a pump 24 arranged to pump the gas out of the chamber 10. Preferably the pump 24 is controlled by a pressure controller 21 arranged to control the pump 24 in order to maintain the pressure at a level within a range of about 10 Pa to 400 Pa, more specifically in a range of about 20 Pa to 200 Pa. In an embodiment, a very suitable pressure level is 100 Pa. Due to the relatively high temperature of operation, such gas pressures may not impair transmissivity of the system to the extreme ultraviolet radiation, especially not if the gas is hydrogen. It will be appreciated that the pressure may be controlled in another manner, for instance, by controlling the fluid supply 16 instead of the pump 24.

In case the module is included in a lithographic projection apparatus, such as the apparatus shown in FIG. 1, the pump 24 may serve to prevent the gas flow GF to flow into other parts of the apparatus, for example to the illumination system IL.

As mentioned earlier, the gas flow may include molecular and/or atomic hydrogen or any other suitable gas. The gas can be supplied by fluid supply 16 by supplying a gas. The fluid supply may also supply a liquid which will change to a gaseous phase upon entry into the chamber 10.

Figure 3:
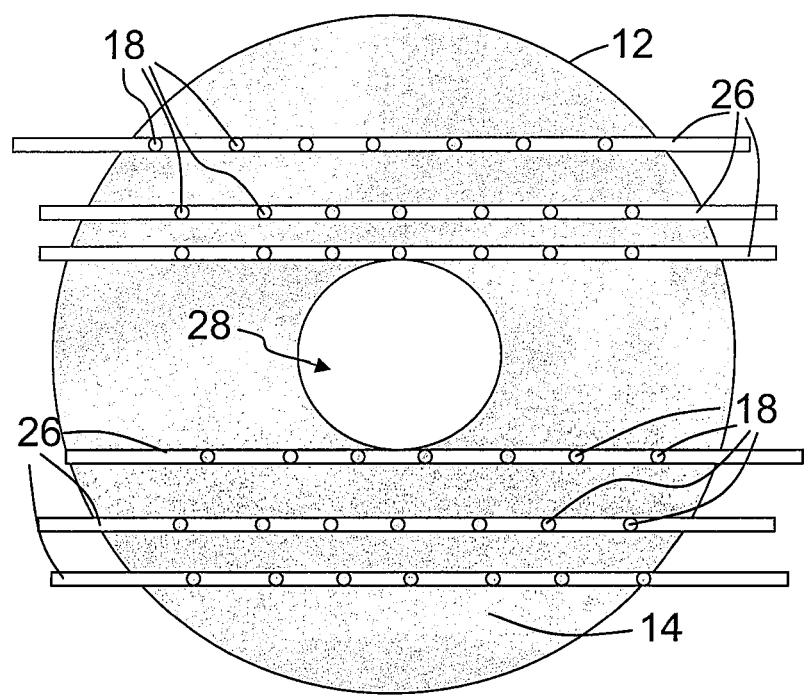
FIG. 3 is a front view of a collector of a module according to an embodiment of the invention.

Referring to FIG. 3, an alternative is disclosed to the embodiment of FIG. 2. The embodiment of FIG. 3 is similar to the embodiment of FIG. 2. A difference is that in the embodiment of FIG. 3, the fluid supply 2 includes one or more manifolds 26 arranged at a location proximate the mirror surface 14 of the collector mirror 12. The manifolds 26 are configured to supply the gas flow through a plurality of apertures 18. By employing the manifolds 26, which may be a structure separate from the collector mirror 12, there is no need to provide apertures in the collector mirror 12. This significantly increases manufacturability of the module according to an embodiment of the invention.

In the embodiment of FIG. 3, the manifolds 26 are positioned in the chamber 10 such that the apertures 18 to direct the gas toward the plasma target ignition position.

Figure 4:
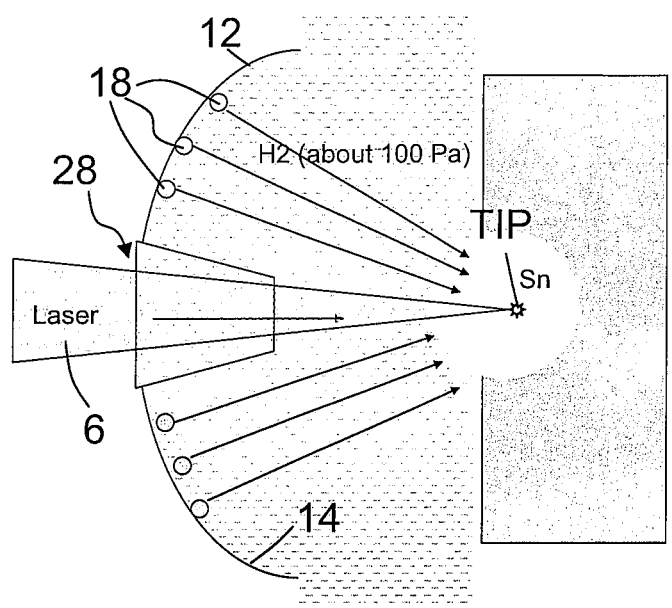
FIG. 4 is a side view of the collector of FIG. 3.

FIG. 4 is a side view of the collector mirror 12 of FIG. 3. In FIG. 4, however, the laser source 6 is shown and extends through a hole 28 (see also FIG. 3).

Figure 5:
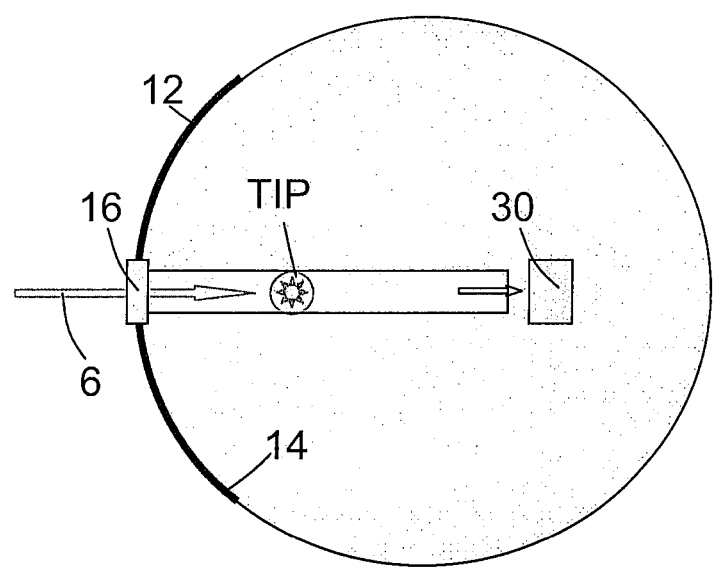
FIG. 5 is a side view of a module according to an embodiment of the invention.

FIG. 5 is a side view of yet another embodiment of the module. The embodiment of FIG. 5 is similar to the embodiment of FIG. 2. However, in FIG. 5, the module 1 additionally includes a gas collection system 30 configured to collect the gas flow including at least a part of the at least a part of the particles from the particle debris. As can be seen in FIG. 5, the gas collection system 30 is configured to collect the gas flow at a location opposite to the fluid supply relative to the target ignition position TIP. The fluid supply 16 and the gas collection system are arranged such that the gas flow may reach a speed of about 100 m/s or any other flow speed within the range of about 10 m/s to 1000 m/s.

As can be seen in FIG. 5, the gas flow supplied by the fluid supply 16 in FIG. 5 is a narrow jet. Use of the gas collection system 30 may be combined with the type of apertures 16 of the embodiments of FIGS. 2 and 3 respectively. In this manner, a more homogeneous and broader gas flow can be obtained as a background gas flow.

Figure 6:
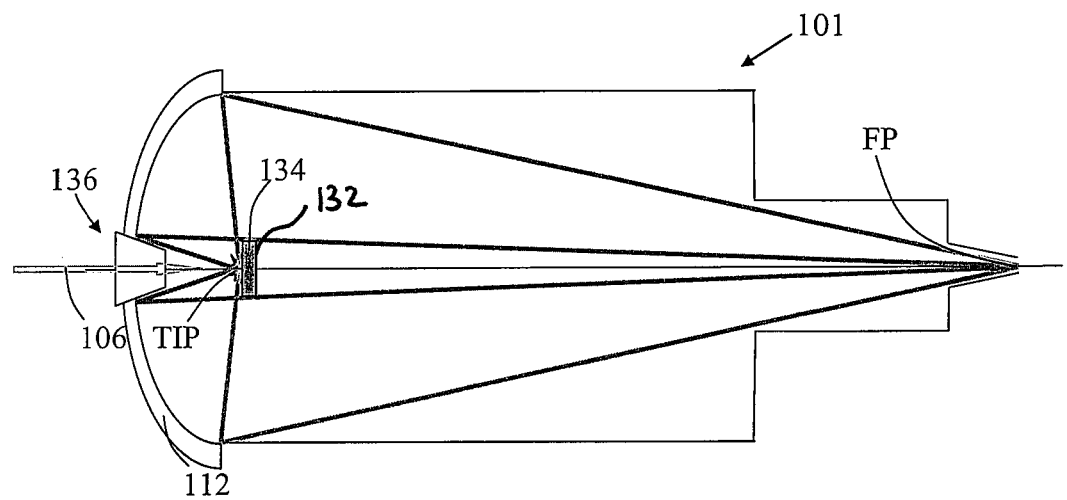
FIGS. 6 and 7 show a module according to an embodiment of the invention.
Figure 7:
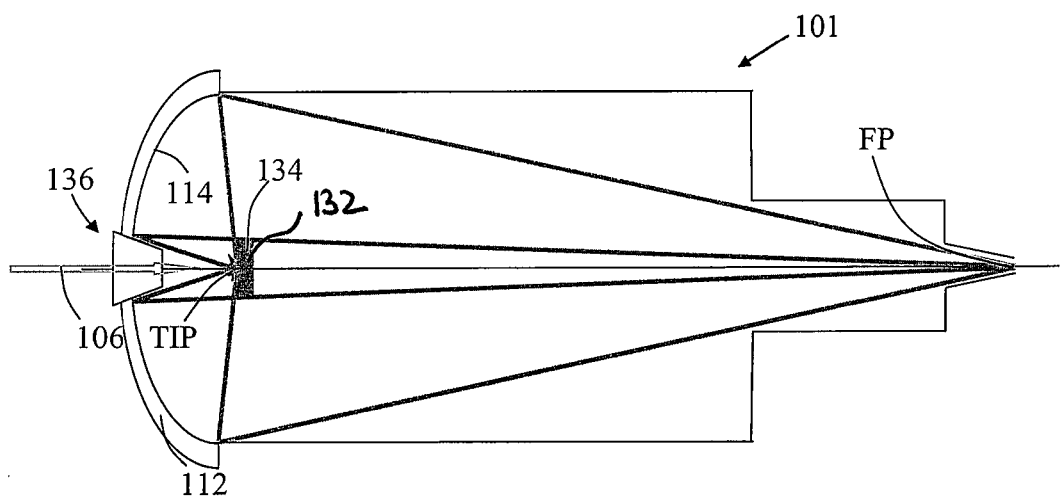

FIGS. 6 and 7 disclose a yet further module 101 for producing extreme ultraviolet (EUV) radiation in accordance with an embodiment of the invention. The module includes an extreme ultraviolet radiation-emitting source, the source being provided with a supply configured to supply a fluid of an ignition material to a predetermined target ignition position TIP. Although not shown in FIGS. 6 and 7 for the sake of clarity, the supply may be the same or at least similar to the supply 2 shown in FIG. 2.

The source may further be provided with a target-igniting mechanism 106, in the respective embodiments of FIGS. 6 and 7 a laser, constructed and arranged to produce a plasma from the ignition material at the target ignition position, the plasma emitting the EUV radiation. In this case, the source is a laser-produced plasma (LPP) source and extends through a hole in a collector mirror 112 having a mirror surface 114. Another type of such a source is a discharge-produced plasma (DPP) source.

The collector 112 is comprised in the module 101 and is constructed and arranged to focus radiation emitted by the plasma to at a focal point FP and a heat sink 132 having a thermal energy-diverting surface 134 constructed and arranged to divert thermal energy away from the target ignition position TIP. The heat sink 132 may be located at a position proximate the target ignition position as shown in FIGS. 6 and 7.

In the embodiments of FIGS. 6 and 7, the module comprises a chamber (not shown in its entirety in the Figures) in which the source, the collector mirror 112 and the heat sink 132 are located. The chamber may contain molecular hydrogen, hydrogen radicals or a mixture thereof.

Figure 8:
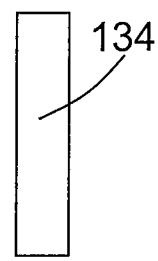
FIG. 8 is a heat sink of the module of FIG. 6.
Figure 9:
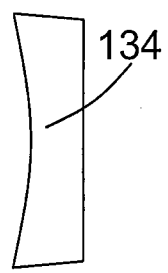
FIG. 9 is a heat sink of the module of FIG. 7.

The module 101 in FIG. 6 differs from the module 101 of FIG. 7 in that the heat sink 132 of the module 101 shown in FIG. 7 has a cylindrical shape (see FIG. 8), while the heat sink 132 of the module 101 shown in FIG. 6 has a conical shape (FIG. 9) and tapers towards the focal point FP. Typically the heat sink 132 may have a cross-section with a diameter of about 80 mm or about 160 mm. The opening angle of the conically-shaped heat sink 132 of FIG. 9 is about 10° or about 20° or in the range between about 10° to 20°.

In both the embodiments of FIGS. 6 and 7, the heat sink 132 is located in a zone which is substantially free of radiation directed by the collector mirror 112 to the focal point FP, because the zone is shielded from reflection by the mirror surface 114 of the mirror 112 by a non-reflective part 136 in the collector mirror. This part 136 of the collector mirror lacks reflectivity, since it is the location where the a target-igniting mechanism 106, i.e. the laser, extends through the collector mirror 112. Thus, the heat sink 132 does not block any EUV radiation reflected by the collector mirror 112 and therefore has no detrimental effect on the EUV radiation intensity at the focal point FP.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method for producing extreme ultraviolet radiation, comprising:
   directing a radiation beam onto a droplet of an ignition material, the droplet being located at a target ignition position, so as to change the droplet into a plasma that is configured to produce an extreme ultraviolet radiation;
   reflecting the radiation using a collector mirror that includes a mirror surface to focus the radiation at a focal point; and
   providing a gas flow that is ejected from a fluid supply comprising a manifold with a plurality of apertures to eject gas, the manifold provided in front of the mirror surface or in front of an edge of the mirror surface, or both, so that said gas is provided by the manifold to the plurality of apertures without passing through said collector mirror, the gas flow being ejected in a manner such that, upon exiting said fluid supply, said gas flow is directed toward the target ignition position in a direction substantially transverse with respect to and away from the mirror surface to mitigate particle debris produced by the plasma.

2. The method according to claim 1, wherein the radiation beam is a laser beam.

3. The method according to claim 1, wherein the gas flow comprises molecular and/or atomic hydrogen.

4. The method according to claim 1, wherein the target ignition position and the mirror are located in a chamber.

5. The method according to claim 4, wherein a gas pressure in the chamber is maintained between about 10 Pa and 400 Pa.

6. The method according to claim 5, wherein the gas pressure is between about 20 Pa and 200 Pa.

7. The method according to claim 1, wherein a plurality of subflows of gas are provided, each of the subflows being directed towards a central region of the mirror surface, such that the gas flow, away from the mirror surface, is provided by collision between the subflows occurring in the central region.

8. The method according to claim 1, wherein the gas flow that includes at least a part of the particles from the particle debris is collected.

9. The method according to claim 8, wherein the gas flow including at least a part of the particles from the particle debris is collected at a location opposite to the mirror surface relative to the target ignition position.

10. A module for producing extreme ultraviolet radiation, comprising:
    a supply configured to supply one or more droplets of an ignition material to a target ignition position;
    a radiation source configured to supply a radiation beam arranged to be focused on the target ignition position and to produce a plasma by hitting a droplet located at the target ignition position so as to change the droplet into an extreme ultraviolet producing plasma;
    a collector mirror including a mirror surface constructed and arranged to reflect the radiation to focus the radiation at a focal point; and
    a fluid supply comprising a manifold with a plurality of apertures to eject gas, the manifold arranged in front of the mirror surface or in front of an edge of the mirror surface, or both, so that said gas is provided by the manifold to the plurality of apertures without passing through said collector mirror, and constructed to form a gas flow that is directed, upon exiting said fluid supply, toward the target ignition position and in a direction substantially transverse with respect to and away from the mirror surface to mitigate particle debris produced by the plasma.

11. The module according to claim 10, wherein the gas comprises molecular and/or atomic hydrogen.

12. The module according to claim 10, wherein the module comprises a chamber in which the target ignition position and the mirror are located.

13. The module according to claim 12, wherein the module comprises one or more pumps arranged to pump gas out of the chamber.

14. The module according to claim 12, wherein the module is provided with a pressure controller constructed to maintain a gas pressure in the chamber between about 10 Pa and 400 Pa.

15. The module according to claim 14, wherein the gas pressure is between 20 Pa and 200 Pa.

16. The module according to claim 10, further comprising one or more pumps, arranged to pump gas out of a chamber in which the target ignition position and the mirror are located and a pressure controller arranged to control the one or more pumps in order to maintain a gas pressure in the chamber between about 10 Pa and 400 Pa.

17. The module according to claim 16, wherein the gas pressure is between about 20 Pa and 200 Pa.

18. The module according to claim 10, wherein the module comprises a plurality of fluid supplies each arranged to provide a subflow of gas, and each of the subflows being directed towards a central region of the mirror surface, such that the gas flow, away from the mirror surface, is provided by collision between the subflows occurring in the central region.

19. A module for producing extreme ultraviolet radiation, comprising:
   a fuel supply configured to supply an ignition material to a position proximate an axis within a chamber;
   a radiation source configured to output a radiation beam, the radiation beam directed to the position so as to irradiate the ignition material to form a plasma that is configured to emit an extreme ultraviolet radiation;
   a collector mirror including a mirror surface positioned within the chamber, the mirror surface constructed and arranged to reflect and focus the extreme ultraviolet radiation on a focal point positioned proximate the axis; and
   a fluid supply comprising a manifold with a plurality of apertures to eject gas, the manifold arranged in front of the mirror surface or in front of an edge of the mirror surface, or both, so that said gas is provided by the manifold to the plurality of apertures without passing through said collector mirror, and constructed to supply a gas flow substantially toward the position so that said gas flow supplied substantially toward the position carries particle debris produced by the plasma away from the mirror surface substantially along a direction of the axis and substantially toward the focal point.

20. The module according to claim 19, wherein the gas flow flows substantially parallel to the axis.

21. The module according to claim 19, wherein the gas flow is configured to flow away from the mirror surface and toward the focal point.

22. The module according to claim 19, wherein the fluid supply includes a first and a second fluid supply units that are configured to produce a first and a second sub-flow, respectively, the first and the second sub-flow directed toward a central region of the mirror surface proximate the axis to form the gas flow.

23. The module according to claim 19, wherein the module comprises a gas collection system configured to collect the gas flow including at least a part of the at least a part of the particles from the particle debris.

24. The module according to claim 23, wherein the gas collection system is configured to collect the gas flow at a location opposite to the fluid supply relative to the target ignition position.

25. A lithographic projection apparatus arranged to project a pattern from a patterning device onto a substrate, the lithographic apparatus comprising:
   an illumination system configured to condition a radiation beam;
   a support constructed to hold a patterning device, the patterning device being capable of imparting the radiation beam with a pattern in its cross-section to form a patterned radiation beam;
   a substrate table constructed to hold a substrate;
   a projection system configured to project the patterned radiation beam onto a target portion of the substrate; and
   a module for producing extreme ultraviolet radiation, the module including
      a supply configured to supply one or more droplets of an ignition material to a target ignition position;
      a radiation source configured to supply a radiation beam arranged to be focused on the target ignition position and to produce a plasma by hitting a droplet located at the target ignition position so as to change the droplet into an extreme ultraviolet producing plasma;
      a collector mirror including a mirror surface constructed and arranged to reflect the radiation to focus the radiation at a focal point; and
      a fluid supply comprising a manifold with a plurality of apertures to eject gas, the manifold arranged in front of the mirror surface or in front of an edge of the mirror surface, or both, so that said gas is provided by the manifold to the plurality of apertures without passing through said collector mirror, and constructed to form a gas flow that is directed, upon exiting said fluid supply, toward the target ignition position and in a direction substantially transverse with respect to and away from the mirror surface to mitigate particle debris produced by the plasma.

26. A method for producing extreme ultraviolet radiation, comprising:
   irradiating an ignition material located at a target ignition position with a radiation beam to form a plasma that is configured to emit an extreme ultraviolet radiation;
   reflecting and focusing the extreme ultraviolet radiation using a collector mirror that includes a mirror surface at a focal point; and
   supplying a gas flow that is ejected from a fluid supply comprising a manifold with a plurality of apertures to eject gas, the manifold arranged in front of the mirror surface or in front of an edge of the mirror surface, or both, so that said gas is provided by the manifold to the plurality of apertures without passing through said collector mirror, in a manner such that, upon exiting said fluid supply, said gas flow is directed toward the target ignition position in a direction substantially transverse with respect to and away from the mirror surface to mitigate particle debris produced by the plasma.

27. The method according to claim 1, wherein at least part of the gas flow is supplied toward the focal point.

28. The method according to claim 1, wherein at least part of the gas flow is directed along a same direction as the radiation.

29. The module according to claim 19, wherein the collector mirror is arranged upstream the position and the focal point is positioned downstream the position.

30. The module according to claim 19, wherein, substantially along the axis, the position is between the collector mirror and the focal point.

31. The method according to claim 7, wherein the plurality of subflows of gas are provided by fluid supplies arranged in front of the edge of the mirror surface.

* * * * *